(12) United States Patent
Yang et al.

(10) Patent No.: US 8,853,780 B2
(45) Date of Patent: Oct. 7, 2014

(54) SEMICONDUCTOR DEVICE WITH DRAIN-END DRIFT DIMINUTION

(75) Inventors: Hongning Yang, Chandler, AZ (US); Daniel J. Blomberg, Chandler, AZ (US); Xu Cheng, Chandler, AZ (US); Xin Lin, Phoenix, AZ (US); Won Gi Min, Chandler, AZ (US); Zhihong Zhang, Chandler, AZ (US); Jiang-Kai Zuo, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/465,761

(22) Filed: May 7, 2012

(65) Prior Publication Data

US 2013/0292764 A1 Nov. 7, 2013

(51) Int. Cl.
*H01L 29/66* (2006.01)

(52) U.S. Cl.
USPC ........... 257/343; 257/335; 257/336; 257/339; 257/340; 257/341; 257/E29.256; 257/E29.258; 257/E29.261

(58) Field of Classification Search
USPC ........................................................ 257/343
See application file for complete search history.

(56) References Cited

U.S. PATENT DOCUMENTS

| | | | | |
|---|---|---|---|---|
| 5,386,136 | A * | 1/1995 | Williams et al. | 257/409 |
| 6,137,140 | A * | 10/2000 | Efland et al. | 257/343 |
| 6,211,552 | B1 * | 4/2001 | Efland et al. | 257/343 |
| 6,552,390 | B2 * | 4/2003 | Kameda | 257/335 |
| 7,282,765 | B2 * | 10/2007 | Xu et al. | 257/343 |
| 7,466,006 | B2 * | 12/2008 | Khemka et al. | 257/492 |
| 7,473,978 | B2 * | 1/2009 | Matsudai et al. | 257/492 |
| 7,535,058 | B2 * | 5/2009 | Liu et al. | 257/335 |
| 7,569,884 | B2 * | 8/2009 | Lee | 257/343 |
| 8,039,902 | B2 * | 10/2011 | Kim et al. | 257/377 |
| 8,159,029 | B2 * | 4/2012 | Su et al. | 257/343 |
| 8,193,585 | B2 * | 6/2012 | Grote et al. | 257/343 |
| 8,269,275 | B2 * | 9/2012 | Chen et al. | 257/336 |
| 8,282,722 | B2 * | 10/2012 | Vonwiller et al. | 106/31.49 |
| 8,304,831 | B2 * | 11/2012 | Zhu et al. | 257/343 |
| 8,330,220 | B2 * | 12/2012 | Khan et al. | 257/343 |

(Continued)

OTHER PUBLICATIONS

Merchant et al., "Dependence of breakdown voltage on drift length and buried oxide thickness in SOI RESURF LDMOS transistors", Proceedings of the 5th International Symposium on Power Semiconductor Devices and ICs, IEEE, 1993, pp. 124-128, ISBN 0-7803-1313-5.*

(Continued)

*Primary Examiner* — Matthew W Such
*Assistant Examiner* — Samuel Lair
(74) *Attorney, Agent, or Firm* — Lempia Summerfield Katz LLC (57) ABSTRACT

A device includes a semiconductor substrate, source and drain regions in the semiconductor substrate, a channel region in the semiconductor substrate between the source and drain regions through which charge carriers flow during operation from the source region to the drain region, and a drift region in the semiconductor substrate, on which the drain region is disposed, and through which the charge carriers drift under an electric field arising from application of a bias voltage between the source and drain regions. A PN junction along the drift region includes a first section at the drain region and a second section not at the drain region. The drift region has a lateral profile that varies such that the first section of the PN junction is shallower than the second section of the PN junction.

19 Claims, 6 Drawing Sheets

(56) References Cited

U.S. PATENT DOCUMENTS

| | | | |
|---|---|---|---|
| 8,350,327 B2* | 1/2013 | Chung et al. | 257/343 |
| 2001/0025961 A1* | 10/2001 | Nakamura et al. | 257/107 |
| 2001/0038125 A1* | 11/2001 | Ohyanagi et al. | 257/347 |
| 2008/0054994 A1* | 3/2008 | Shibib et al. | 327/538 |
| 2008/0191277 A1* | 8/2008 | Disney et al. | 257/343 |
| 2008/0246086 A1* | 10/2008 | Korec et al. | 257/343 |
| 2009/0020813 A1* | 1/2009 | Voldman | 257/343 |
| 2011/0127607 A1* | 6/2011 | Cai | 257/339 |
| 2011/0260247 A1* | 10/2011 | Yang et al. | 257/343 |
| 2012/0161233 A1* | 6/2012 | Ito | 257/343 |
| 2013/0015523 A1* | 1/2013 | You | 257/343 |

OTHER PUBLICATIONS

Vijay Parthasarathy et al., "A Double RESURF LDMOS with Drain Profile Engineering for Improved ESD Robustness," IEEE Electron Device Letter, vol. 23, No. 4, pp. 212-214 (2002).

R. Zhu et al., "Engineering RESURF LDMOSFETs for Robust SOA, ESD Protection and Energy Capability," $19^{th}$ ISPSD, pp. 185-188 (2007).

\* cited by examiner

SEMICONDUCTOR DEVICE WITH DRAIN-END DRIFT DIMINUTION

FIELD OF INVENTION

The present embodiments relate to semiconductor devices.

BACKGROUND

Integrated circuits (ICs) and other electronic devices often include arrangements of interconnected field effect transistors (FETs), also called metal-oxide-semiconductor field effect transistors (MOSFETs), or simply MOS transistors or devices. A typical MOS transistor includes a gate electrode as a control electrode and spaced apart source and drain electrodes. A control voltage applied to the gate electrode controls the flow of current through a controllable conductive channel between the source and drain electrodes.

Power transistor devices are designed to be tolerant of the high currents and voltages that are present in power applications such as motion control, air bag deployment, and automotive fuel injector drivers. One type of power MOS transistor is a laterally diffused metal-oxide-semiconductor (LDMOS) transistor. In an LDMOS device, a drift space is provided between the channel region and the drain region.

LDMOS devices may be designed to operate in a high-side configuration in which all of the device terminals are level shifted with respect to the substrate potential. Devices configured for high-side operation have been applied in power switchers in DC-to-DC converters, which have respective LDMOS devices for the high side and low side. High-side capable devices may be designed to prevent a direct punch-through path from a body region of the LDMOS device to an underlying, heavily doped substrate.

LDMOS devices are often used in applications, such as automotive applications, involving operational voltages greater than 45 Volts. Breakdown resulting from applying such high voltages to the drain is often prevented through a reduced surface field (RESURF) structure of the LDMOS device design. The RESURF structure is designed to deplete the drift space of the LDMOS device in both vertical and lateral directions, thereby reducing the electric field in the PN junctions surrounding the drift region and thus raising the breakdown voltage (BVDSS) of the device.

Typically a trade-off exists between BVDSS and drain-source ON-resistance (Rdson). BVDSS determines the achievable output voltage rating for the device. Rdson determines the device area required to handle a given amount of current, e.g., the current or power rating of the device. Designing a device to achieve a higher BVDSS level (and therefore higher operating voltage) is often at the cost of increased Rdson (and thus lower current rating per unit area). For example, the BVDSS level may be increased by increasing the length of the drift space of the device or reducing the dopant concentration in the drift space, both of which increase Rdson. Conversely, designing a device to reduce Rdson (and thus increase the current rating per unit area) leads to lower BVDSS levels (and thus lower operating voltage). For example, a higher dopant concentration in the drift space lowers Rdson at the expense of a lower BVDSS. Other Rdson reduction techniques involve increasing device area and, thus, the manufacturing cost of the device.

BRIEF DESCRIPTION OF THE DRAWINGS

The components and the figures are not necessarily to scale, emphasis instead being placed upon illustrating the principles of the invention. Moreover, in the figures, like reference numerals designate corresponding parts throughout the different views.

DETAILED DESCRIPTION OF THE PRESENTLY PREFERRED EMBODIMENTS

Laterally diffused metal oxide semiconductor (LDMOS) and other power transistor devices and electronic apparatus have a diminished drift region at or under a drain region. Drain-side diminution of the drift region may extend a breakdown voltage (BVDSS) level of the devices and apparatus beyond that typically achieved via reduced surface field (RE-SURF) techniques. In RESURF configurations, the electric field levels near the vertical and lateral PN junctions that surround the drift region are reduced via depletion of the drift region. The diminution of a drain-side section of the drift region may ensure that the drift region is fully depleted under the drain region upon application of a drain-source bias voltage. The drain side of the drift region of the disclosed devices and apparatus may be configured to provide RESURF benefits despite drift region lengths (e.g., greater than 5 µm) that may otherwise limit or hamper the RESURF effect. The BVDSS level of the disclosed devices and apparatus may thus exceed a mutual RESURF limit typically presented in field drift devices having long drift regions.

The diminution of the drift region of the disclosed devices and apparatus may vary. In some embodiments, the drift region is cut-off at or under the drain region. Alternatively or additionally, the drift region is thinned at or under the drain region. Though diminished, the drift region may nonetheless include a current pass section that connects or links the drain region to the remainder of the drift region. Outside of the current pass section, the diminished nature of the drift region at the drain region may enhance the RESURF effect along the PN junction near the drain region. This enhancement compensates for the typical weakening of the RESURF effect near the drain region at long drift lengths, such as about 5 μm or more. Through such compensation, the RESURF effect is no longer limited and may thus contribute to further increases in the BVDSS level.

The disclosed devices and apparatus may be useful in a wide variety of high voltage applications, such as high voltage power switching applications. Such applications benefit from transistors capable of low on-resistance (Rdson) and BVDSS levels at least about 15-20V higher than the operation voltage (e.g., about 45V or more). Some automotive high voltage applications for which the disclosed devices and apparatus may be used involve BVDSS levels at 65V, 85V, and 125V. The RESURF effect may be used to increase the BVDSS level by achieving near constant electric field strengths in and around the drift region (e.g., under a shallow trench isolation (STI) region) through two-dimensional depletion of the drift region. Complete depletion may be achieved along both the vertical and lateral PN junctions formed with the drift region, thereby resulting in a mutual RESURF effect.

While the BVDSS level may be increased by lengthening the drift region (up through drift lengths of about 5 μm) and by reducing the dopant concentration level of the drift region (at the expense of increased Rdson), the disclosed devices and apparatus modify the drain-side section of the drift region to obtain still further increases in the BVDSS level. This drain-side modification differs from other configurations, which may, for instance, create a multi-layer drift region, which adds complexity and cost to the fabrication process. The benefits of the drain-side section modification may be achieved without adding an implantation or other step to the fabrication process, increasing device size, or detrimental increases of Rdson.

The drain-side modification of the drift region may include both lateral and vertical non-uniformities. In some cases, formation of the drift region is laterally cut-off under the drain region. The lateral extent of the drift region across the drain region may thus be non-uniform after annealing. On one side of the cut-off, the drift region may include a conduction or current pass section that reaches the drain region. The current pass section may be disposed along the STI region. On the other side, the drift region may include a lower doped section adjacent the conduction path under the drain region. The lower doped section may additionally or alternatively be thinner and shallower than the current pass to promote depletion during operation.

Although described below in connection with n-channel LDMOS transistors, the disclosed devices are not limited to any particular transistor configuration. For instance, application of the features of the disclosed devices is not limited to LDMOS or other power MOS devices. One or more features of the disclosed devices may be applied to other device configurations, including, for instance, bipolar transistors. For example, the configuration of the field drift regions of the disclosed devices may be useful in a wide variety of power electronic devices. The field drift regions are also not limited to any one particular type of RESURF configuration. The disclosed devices may have varying RESURF structures, including single, double, or other RESURF structural arrangements, each of which may be referred to herein as a "RESURF transistor." The disclosed devices are also not limited to field drift devices. One or more aspects of the disclosed devices may be applied in the context of an active drift device configuration.

For convenience of description and without any intended limitation, n-channel LDMOS devices are described and illustrated herein. The disclosed devices are not limited to n-channel devices, as p-channel and other types of devices may be provided by, for example, substitution of semiconductor regions of opposite conductivity type. Thus, for example, each semiconductor region, layer or other structure in the examples described below may have a conductivity type (e.g., n-type or p-type) opposite to the type identified in the examples below.

Figure 1:
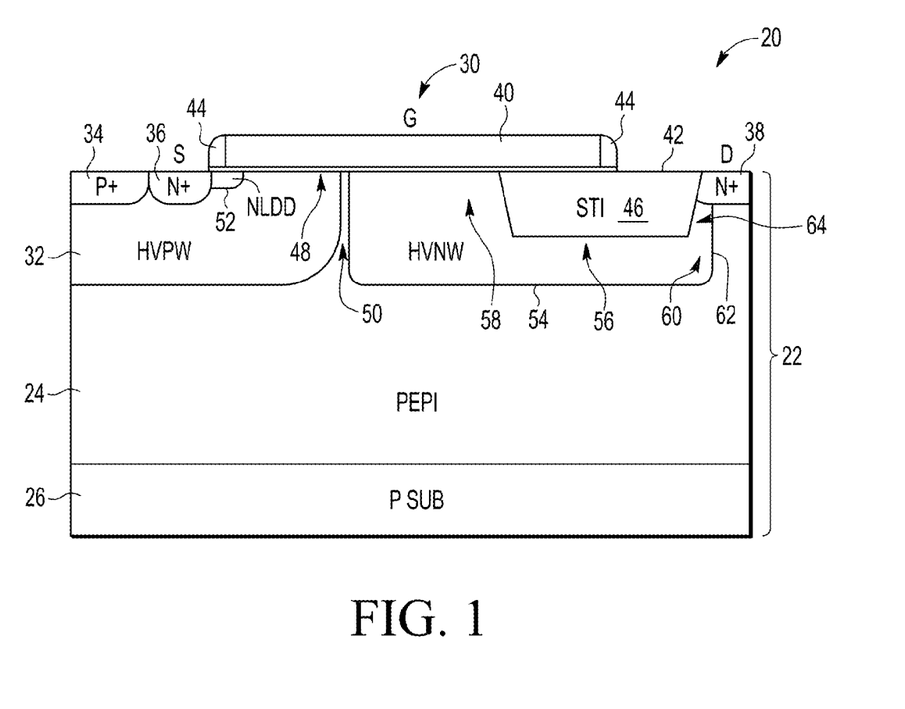
FIG. 1 is a cross-sectional, schematic view of an exemplary field drift LDMOS transistor with a drift region having a drain-side section configured in accordance with one embodiment.

FIG. 1 is a schematic cross-sectional view of an example of an n-channel field LDMOS device 20 constructed in accordance with one embodiment. The device 20 is configured as a RESURF transistor as described below. The device 20 includes a semiconductor substrate 22, which may, in turn, include a number of epitaxial layers 24. In this example, the semiconductor substrate 22 includes a single p-type epitaxial layer p-epi grown on an original substrate 26 (e.g., a heavily doped p-type substrate). The device 20 may alternatively or additionally include non-epitaxial layers in which one or more device regions are formed. Any one or more of the layers of the semiconductor substrate 22 may include silicon. The structural, material, and other characteristics of the semiconductor substrate 22 may vary from the example shown. For example, the semiconductor substrate 22 may include a silicon-on-insulator (SOI) construction. Additional, fewer, or alternative layers may be included in the semiconductor substrate 22. For example, any number of additional semiconductor and/or non-semiconductor layers may be included. The disclosed devices are thus not limited to, for instance, bulk silicon substrates or substrates including epitaxially grown layers, and instead may be supported by a wide variety of other types of semiconductor substrates.

An active area 30 of the device 20 is depicted in FIG. 1. One or more device isolation regions may define the active area 30. Such isolation regions may surround the active area 30. For example, one or more heavily doped n-type isolation wells or sinks (not shown) may define the periphery of the active area 30 and isolate the device 20 from adjacent devices. Alternatively or additionally, isolation may be provided via one or more deep trenches that include, for instance, an oxide plug in a deep trench isolation (DTI) arrangement. The semiconductor substrate 22 may additionally include one or more buried layers (not shown), such as an n-type buried layer (NBL), which may be formed in a dedicated epitaxial layer. Such buried layers may extend across (e.g., under) the active area 30 of the device 20 to act as a barrier or isolating layer separating the active area 30 from the rest of the substrate (e.g., the original substrate 26). Any number of the isolating wells, sinks, or buried layers may be connected to one another.

The device 20 includes a device body or body region 32 in the semiconductor substrate 22. The body region 32 may include a p-type well formed in the epitaxial layer 24 of the substrate 22. In this example, the p-type well is configured for high voltage operation and accordingly labeled a high voltage p-well, or HVPW. The body region 32 may be biased via a heavily doped p-type body contact region 34 formed in or otherwise above the p-type well of the body region 32 in the semiconductor substrate 22. The dopant concentration of the contact region 34 may be at a level sufficient to establish an ohmic contact to the body region 32.

The device 20 includes heavily doped n-type source and drain regions 36 and 38 in the semiconductor substrate 22. The heavily doped n-type source region 36 is disposed within the body region 32. The heavily n-type doped drain region 38 is spaced from the body region 32. The regions 36, 38 may have a dopant concentration at a level sufficient to establish ohmic contacts to bias the source region 36 and the drain region 38. In a typical LDMOS configuration, the drain region 38 is biased at a high voltage, Vds, relative to the source region 36, which may, for example, be considered to be at ground potential.

The device 20 includes a gate structure 40 formed on or above a surface 42 of the semiconductor substrate 22 between the source and drain regions 36, 38. The gate structure 40 is located on or above a gate dielectric. For example, the gate dielectric may include silicon dioxide (or oxide) grown, deposited, or otherwise formed on the surface 42. The gate structure 40 includes a conductive gate on or above the gate dielectric, which insulates the conductive gate from the substrate 22. The gate structure 40 may include one or more dielectric sidewall spacers 44 disposed along lateral edges of the gate structure 40. The sidewall spacers 44 may cover the lateral edges to act as a silicide blocker to prevent a silicide short along the surface 42. The sidewall spacers 44 may provide spacing to separate the conductive components of the gate structure 40 from the source region 36 and other regions of the active region 30. In this example, one of the sidewall spacers 44, located on the source side of the gate structure 40, is used for alignment purposes in defining an edge of the source region 36.

The components, materials, and other characteristics of the gate structure 40 may vary from the example shown. For instance, the gate structure 40 may include one or more additional conductive gates. Each such gate structure may mirror or match the gate structure 40. In some examples, the device 20 includes a dual-gate structure. Further details regarding examples of dual-gate structures are described in U.S. Pat. No. 7,608,513 ("Dual Gate LDMOS Device Fabrication Methods") and U.S. Pat. No. 7,795,674 ("Dual Gate LDMOS Devices"). The components, materials, and other characteristics of the gate structure(s) 40 may otherwise vary from the example shown.

One or more shallow trench isolation (STI) regions 46 may be formed at the surface 42 in the semiconductor substrate 22. In this embodiment, one such STI region 46 spaces the gate structure 40 from one or more conductive regions in the semiconductor substrate 22 in the active region 30 of the device 20. For example, the STI region 46 may isolate the gate structure 40 from the high voltage applied to the drain region 38. Hot carrier injection into the oxide layer of the gate structure 40 may thus be avoided or minimized The STI region 46 may also isolate other components of the device 20 from the high voltage applied to the drain region 38, including, for instance, the regions 34, 36, and 48.

When the gate structure 40 is biased, charge carriers (in this case, electrons; alternatively, holes) accumulate in a channel area or region 48 of the body region 32 under the gate structure 40. In this example, the accumulation of electrons results in a charge inversion in the channel region 48 from the p-type body region 32 to an n-type conduction layer or area near the surface 42 of the semiconductor substrate 22. Once a sufficient amount of the charge carriers accumulate in the conduction layer or area, charge carriers can flow from the source region 36 toward the drain region 38 through the channel region 48. The layer or area in which the charge carriers accumulate may be referred to as an accumulation region of the device 20.

The channel region 48 may include other regions or areas in the semiconductor substrate 22 in which charge inversion occurs as a result of the bias applied to the gate structure 40. Charge carriers may also accumulate at the surface 42 of the substrate 22 outside of or beyond the body region 32. In this example, charge carriers may accumulate in an area near the surface 42 in a region 50 of the epitaxial layer 24 adjacent the body region 32. The area of the region 50 of the epitaxial layer 24 may, in some cases, be considered to be part of the channel region 48 of the device 20. Alternatively, such regions may be considered an accumulation region of the device 20 to distinguish such regions from the channel region 48 in the body region 32. The channel region 48 and the accumulation region may form part of a conduction path or region of the device 20.

The accumulation region(s) of the device 20 need not be limited to regions in which charge inversion occurs. The accumulation region of the device 20 may include areas or regions having the conductivity type opposite than the conductivity type of the body region 32. In this example, the accumulation region may thus include an n-type region, such as a portion of an n-type field drift region (or layer or area thereof) described below.

The conduction path of the device 20 may include other regions, whether n-type or p-type, at or near the surface 42 in which conduction is enabled or enhanced via the bias voltage applied to the gate structure 40. For example, the conduction path may include one or more intermediately doped n-type transition regions 52 in the semiconductor substrate 22 at or near the surface 42. The region(s) 52 may provide further protection for the gate structure 40. In this example, one such n-type transition region 52 (labeled in FIG. 1 as "nldd," or n-type lightly doped drain) extends from the source region 36 under the edge of gate structure 40. The n-type transition region 52 may be a diffused region formed in connection with the source region 36. The n-type transition region 52 may help prevent hot carrier injection into the oxide or other component of the gate structure 40. Another transition region may extend from the drain region 38 toward the gate structure 40. The n-type transition region(s) 52 may assist in controlling the electric field at or near the surface 42, including in areas other than those areas near the source region 36 or the drain region 38.

The device 20 includes a drift region 54 in the semiconductor substrate 22. The drift region 54 may be adjacent to, and/or spaced from, the body region 32. The drift region 54 is configured such that the charge carriers drift under the electric field arising from the voltage applied between the drain region 38 and the source region 36. During operation, the drift region 54 electrically couples the drain region 38 to the channel region 48 and the source region 36. The drift region 54 (or one or more portions thereof) thus forms part of the conduction path of the device 20.

The drift region 54 may be configured for depletion during operation to reduce the magnitude of the electric field, via the reduced surface field (RESURF) effect, in various locations in the active area 30 for improved breakdown performance. The drift region 54 is further configured to achieve both a high breakdown voltage level and a low drain-source resistance (Rdson) by leveling the electric field in certain locations within the drift region 54. In some locations, such as under the STI region 46, a leveled or constant electric field may, in fact, correspond with an increase in the electric field relative to conventional RESURF designs. An exemplary comparison of the electric field distributions is shown and described in connection with FIG. 8.

The drift region 54 may be depleted both laterally and vertically, at least in part, during operation along reverse-biased PN junctions with, for instance, the epitaxial layer 24 and/or the body region 32. The junctions are reverse biased as a result of the application of a drain voltage Vds between the source region 36 and the drain region 38. The reverse-biased junctions may reduce the electric field, as in the RESURF effect, for improved breakdown performance. In an alternative embodiment, the device 20 may be configured to establish a double RESURF effect, in which, for example, one or more additional regions may be disposed adjacent the drift region 54 for further depletion in the active area 30. Further details regarding the structural and operational characteristics of suitable RESURF regions are set forth in U.S. Pat. No. 6,882,023 ("Floating RESURF LDMOSFET and Method of Manufacturing Same").

The drift region 54 includes a field drift portion or section 56 under the STI region 46. The field drift section 56 may have a lateral length of approximately 5 microns or more. The field drift section 56 is disposed between an accumulation-side section 58 and a drain-side section 60 of the drift region 54. During operation, charge carriers drift through each of these sections 56, 58, 60 under the electric field arising from the drain-source bias voltage. Each section 56, 58, 60 thus includes or defines part of the conduction path of the device 20. In this example, the charge carriers enter the accumulation section 58 after exiting the channel region 48, drift around the STI region 46 through the field drift section 56, to reach the drain-side section 60. Each of these sections 56, 58, 60 may have a dopant concentration profile that establishes a suitable Rdson value. The dopant concentration profile may vary over the depth in each section 56, 58, 60. For example, the dopant concentration level in the field drift section 56 may be higher near the STI region 46 than near the PN junction with the epitaxial layer 24. The drain-side section 60 of the drift region may have a dopant concentration level that varies both laterally and vertically, as described in the examples below.

The drain-side section 60 is configured such that the drift region 54 has a lateral profile that varies across the drain region 38. The configuration of the drift region 54 may allow the drift region 54 to be fully depleted under or along the drain region 38. The lateral profile of the drift region 54 may vary in different ways. In this example, the lateral profile varies in the sense that the drift region 54 does not extend across the entire lateral extent of the drain region 38. The drain-side section 60 may thus extend only partially across the drain region 38. The drain-side section 60 of the drift region 54 of the embodiment shown in FIG. 1 has a lateral profile with a cut-off or edge 62. The edge 62 is configured as an upright or vertical wall. However, a thermal anneal after implant may smoothen the sharp edge(s) of the wall. A current pass section 64 of the drift region 54 is defined between the edge 62 and the STI region 46. The current pass section 64 provides a low resistance path through which the charge carriers drift during operation under the applied bias voltage. The cut-off 62 in the drain-side section 60 of the drift region 54 may thus avoid adversely affecting the on-resistance of the device 20. As described below, the increase in the Rdson value is negligible in several exemplary devices.

The lateral width of the current pass section 64 may vary from the example shown. The extent to which the drift region 54 extends across the lateral width of the drain region 38 may vary accordingly. By cutting off the lateral extent of the drift region 54 under the drain region 38, the device 20 may avoid operational conditions in which some of the drift region 43 is not fully depleted, which may reduce the RESURF effect. The cut-off 62 removes the portion of a conventional drift region in which depletion is less likely to occur due to the length of the field drift section 56.

The cut-off 62 may be oriented non-vertically in other embodiments. The shape of the drain-side section 60 and/or the current pass section 64 may thus vary. The drain-side section 60 may not have an upright wall due to, for instance, diffusion during an annealing step. In these and other cases, the current pass section 64 may constitute a portion of the drain-side section 60 adjacent or proximate the STI region 46. The current pass section 64 may have a dopant concentration level configured for a suitable or acceptable on-resistance. The dopant concentration level may decrease as the spacing or distance from the STI region 64 increases. A distal portion of the drain-side section 60 may thus have a lower dopant concentration level than the current pass section 64.

The device 20 is shown in simplified form and, thus, FIG. 1 does not show the conductive (e.g., ohmic) contacts and other metal layers configured for electric coupling with the drain region 38, the source region 36, and the gate structure 40. The device 20 may have a number of other structures or components for connectivity, isolation, passivation, and other purposes not shown in FIG. 1 for ease in illustration. For instance, the device 20 may include any number of additional isolation regions or layers. In some examples, another p-type epitaxial layer (not shown) may be configured as a p-type barrier layer. One or more STI regions, isolation trenches, and/or isolation wells (not shown) may be provided to isolate the active region 30 and/or the body region 32.

The dopant concentrations, thicknesses, and other characteristics of the other above-described semiconductor regions in the semiconductor substrate 22 may vary. In one example, the above-referenced semiconductor regions may have the following approximate concentrations and thicknesses. Exemplary dopant concentration levels for the drift region (and portions or sections thereof) are provided below in connection with the embodiment depicted in FIG. 2.

|  | Concentration | Thickness |
| --- | --- | --- |
| substrate 22: | $1 \times 10^{15}/cm^3$ | 10 µm |
| p-epi 24: | $1 \times 10^{15}/cm^3$ | 5 µm |
| substrate 26: | $1 \times 10^{20}/cm^3$ | not applicable |
| body 32: | $1 \times 10^{17}/cm^3$ | 3 µm |
| source 36: | $1 \times 10^{21}/cm^3$ | 0.25 µm |
| drain 38: | $1 \times 10^{21}/cm^3$ | 1.0 µm |
| STI 46: | not applicable | 0.35 µm |

The concentrations and thicknesses may be different in other embodiments. The concentration may vary considerably in some regions between embodiments, including, for instance, the original substrate 26.

FIG. 1 may also depict the device 20 in simplified form in the sense that only one side of the device 20 is shown. The device 20 may include another side configured in a manner similar to the depicted side. For example, the other side of the device 20 may mirror or match the depicted side, such that the device 20 is symmetrical about the drain region 38. The drain region 38 may thus be disposed in the center (or along a central line) of the device 20. The other side may thus include a second source region separated from the drain region 38 by a second gate structure. In some embodiments, the second source region and the second gate structure are contiguously formed with the corresponding regions 36, 40 of the device 20 described above via one or more connecting structures offset from the lateral cross-section shown in FIG. 1. For example, the gate structure 40 may be U-shaped or arched-shaped (e.g., a single lateral connection) or toroidal or looped (e.g., two lateral connections) when viewed from above. The shapes of the above-described regions of the device 20 may vary considerably from these examples.

Figure 2:
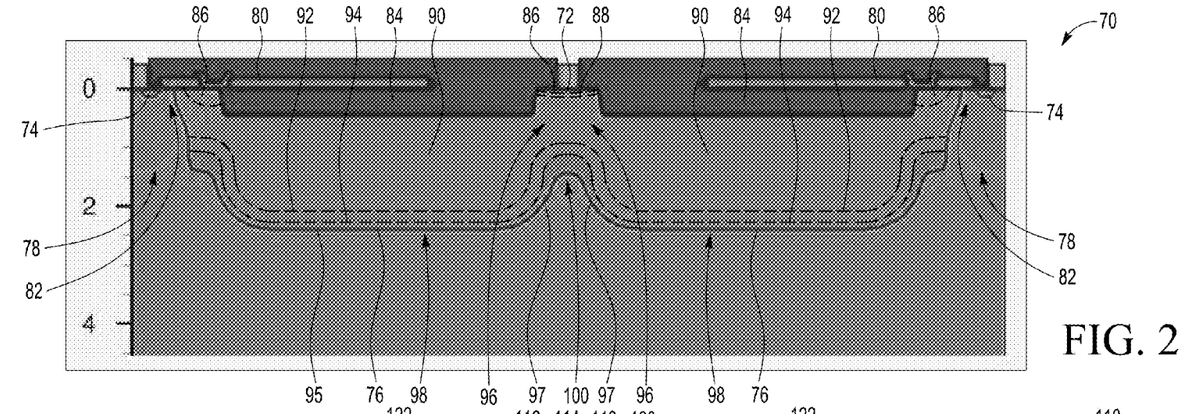
FIG. 2 is a cross-sectional, schematic view of an exemplary field drift LDMOS transistor showing dopant concentration levels in a drift region having a drain-side section configured in accordance with one embodiment.

FIG. 2 depicts a cross-sectional view of a device 70 configured in accordance with one embodiment. In this example, the device 70 is an LDMOS transistor having an n-type channel. The device 70 is symmetrical about a central drain region 72. A source region 74 is electrically coupled to the drain region 72 via a drift region 76. The source region 74 is disposed on, in, or otherwise above a body region 78. The device 70 includes a gate 80 between the drain and source regions 72, 74. The gate 80 extends laterally across the active area of the device 70 over a channel region 82 as well as an STI region 84 formed in the drift region 76. The drain region 72 is disposed between opposing portions of the STI region 84. These and other regions of the device 70 may be configured in a manner similar to the corresponding regions of the device 20 of FIG. 1.

The cross-sectional view of FIG. 2 presents an exemplary dopant concentration profile of the drift region 76. The drift region 76 is depicted with a number of dashed lines to differentiate between different dopant concentration levels or ranges. While the dopant concentration level varies continuously within the drift region 76, the dashed lines are intended to provide a rough indication of the dopant concentration profile, rather than an indication of sharp or discrete variances therein. In this example, the drift region 76 includes several regions 86 of relatively high concentration levels relative to the remainder of the drift region 76. For example, the regions 86 may have a concentration level slightly below the concentration level of the above-described ohmic contact regions. The regions 86 are located in the accumulation region of the device 70 and adjacent the drain region 72. In some cases, these regions may correspond with moderately doped LDD regions, as described above. The concentration level in the regions 86 may, for example, fall in the range from about $5 \times 10^{15}/cm^3$ to about $5 \times 10^{17}/cm^3$.

The dopant concentration level varies in the drift region 76 to define a number of other regions or areas of the drift region 76. In this example, the drift region 76 includes a region 88 and a primary region 90. The primary region 90 may include the field drift and other sections of the drift region 76 through which the charge carriers drift during operation. The concentration level at the region 86 near the drain region 72 decreases to a lower level in the region 88, which may fall in a range from about $2 \times 10^{15}/cm^3$ to about $5 \times 10^{16}/cm^3$. The primary region 90 of the drift region 76 may then have a concentration level lower than the regions 86 and 88, such as in the range from about $5 \times 10^{15}/cm^3$ to about $1 \times 10^{17}/cm^3$. The concentration level then tapers off further in regions 92 and 94 as the distance from the drain region 72, the STI region 84, or the channel region 82 increases. The region 92 may have a concentration level that falls in the range from about $1 \times 10^{15}/cm^3$ to about $1 \times 10^{16}/cm^3$. The region 94 may have a concentration level that falls in the range from about $1 \times 10^{15}/cm^3$ to about $5 \times 10^{15}/cm^3$.

The arrangement of the above-described sections of the drift region 76 is configured to diminish the drift region 76 at the drain region 72. The arrangement may modify the size, depth, lateral profile, and/or other characteristics of the drift region 76 at or near the drain region 72. These modifications diminish the drift region 76 below the drain region 72 to increase the extent to which the drift region 76 is depleted under or near the drain region 72 during operation. In some cases, the diminishment of the drift region 76 leads to the full depletion of the drift region 76 under or near the drain region 72 during operation. The RESURF effect may thus be enhanced despite conditions (e.g., a long field drift region) that may otherwise limit the RESURF effect.

The enhancement of the RESURF effect is provided while maintaining one or more current pass region(s) 96 for low-resistance path(s) for the charge carriers. The current pass region(s) 96 may be disposed adjacent the STI region 84. The drift region 76 narrows or necks down at the drain region 72 to define the current pass region 96, which electrically links the drain region 72 to the primary region 90 of the drift region 76 and the remainder of the conduction path of the device 70. The charge carriers may thus reach the drain region 72 without encountering an area of low dopant concentration or high resistivity. In some cases, the current pass region 96 does not extend across the drain region 72 (see, e.g., FIG. 1). In this example, however, a portion of the current pass region(s) 96 located in the regions 86 and 88 may extend across the drain region 72. As shown in FIG. 2, the dopant concentration level may also remain within the range for the primary region 90 across the lateral width of the drain region 72. Notwithstanding the foregoing, the concentration level may nonetheless decrease in these areas across the lateral width of the drain region 72. For example, at any given depth or distance from the drain region 72, the concentration level may decrease from levels reached closer to the STI region 84. For a given lateral position under the drain region 72, the concentration level under the drain region 72 may additionally or alternatively decrease with increasing depth (e.g., within and/or relative to the region 90).

The lateral profile of FIG. 2 shows how the drift region 76 is thinner near the drain region 72. In this example, the primary region 90 of the drift region 76 necks down at or below the drain region 72 as shown. The depth of the regions 92 and 94 thus varies across the lateral extent of the drift region 76, decreasing at the drain region 72. The regions 92 and 94 are shallower under the drain region 72. The thinning of the drift region 76 under the drain region 72 modifies the depth or position of a PN junction 95 between the drift region 76 and the underlying substrate (e.g., a p-type epitaxial layer of the substrate). As shown in the lateral profile of FIG. 2, those parts or sections of the PN junction 95 under or along the drain region 72 are shallower than those parts or sections not under or along drain region 72.

The lateral profile of the drift region 76 includes one or more inner dopant concentration cut-offs or drop-offs 97 under the drain region 72. The inner dopant concentration cut-off 97 diminishes the drift region 76 at or under the drain region 72. Such diminishment of the drain-side of the drift region 76 may vary. The diminishment of the drift region 76 may begin with the cut-off 97. The diminishment is thus located under the drain region 72. The dopant concentration cut-off 97 may include a drop-off in both depth and dopant concentration level. Alternatively, the dopant concentration cut-off 97 may include a drop-off in depth alone, or a drop-off in dopant concentration level alone. The cut-off 97 divides the drift region 76 into an outer section 98 and an inner section 100. The inner section 100 is disposed under or along the drain region 72, while the outer section is not. The outer section 98 may laterally surround the inner section 100 in some embodiments. The cut-off 97 in this example is non-vertical, which may reflect dopant diffusion after an implantation procedure. The cut-off 97 need not reduce the dopant concentration level under the drain region 72 to zero as shown in the example of FIG. 1. For example, diffusion from the drain region 72 may lead to the formation of the regions 86 and 88. The implantation procedure may use a mask that defines the cut-off 97 at positions at the drain region 72, such as those shown in FIG. 1.

The cut-off 97 may also lead to different dopant concentration profiles for the outer and inner sections 98, 100 of the drift region 76. At a respective or given depth in the substrate, the dopant concentration level in the inner section 98 is lower than the dopant concentration level in the outer section 98. For example, at some depths, the concentration level in the inner section 100 falls in the range of the region 92, while the concentration level in the outer section 98 falls in the range of the primary region 90. At an increased depth, the concentration level in the inner section 100 may then fall in the range of the region 94, while the concentration level in the outer section 98 may remain in the range of the primary region 90 or fall in the range of the region 92. These lateral differences in the dopant concentration level in the drift region may help to enhance depletion along the PN junction 95 in the lateral direction. In some cases, full depletion is achieved laterally across the inner section 100 under the drain region 72. Furthermore, because the inner section 100 has a bottom shallower than a bottom of the outer section 98, depletion is also enhanced in the vertical direction. In some cases, full depletion may be achieved vertically in the outer and inner sections 98, 100. Two-dimensional or mutual RESURF may thus be enhanced despite the length of the drift region 76.

Figure 3:
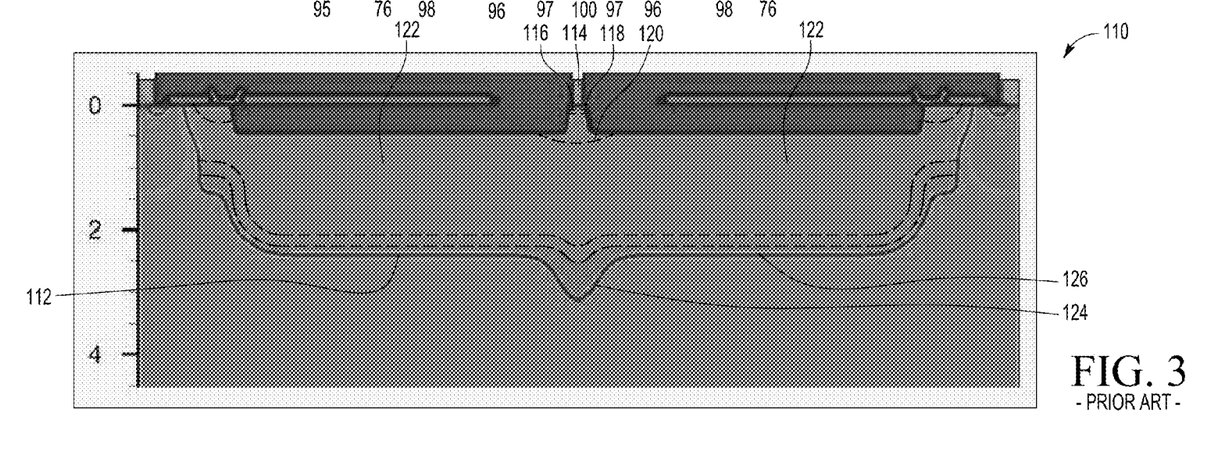
FIG. 3 is a cross-sectional, schematic view of an example of a conventional field drift LDMOS transistor showing dopant concentration levels in a drift region thereof.

FIG. 3 is a cross-sectional view of a conventional field drift LDMOS device 110 to depict the manner in which the dopant concentration profile of a drift region 112 differs from the above-described embodiments near or under a drain region 114. The dopant concentration levels of the drift region 112 of the conventional device 110 are generally higher under the drain region 114 relative to, for instance, the embodiment of FIG. 2. For example, the drift region 112 includes regions 116, 118, 120 of relatively high concentration levels relative to a primary region 122 of the drift region 112. The region 120 extends to a depth below the drain region 114 that renders full lateral and vertical depletion of the drift region 112 unlikely for long drift lengths. The dopant concentration level in the primary region 122 below the region 120 may also be higher than the corresponding region in the embodiment of FIG. 2. These increased dopant concentration levels may also lead to a downward protrusion or extension 124 along a section of a PN junction 126 between the drift region 112 and the surrounding substrate (e.g., an epitaxial layer thereof). The downward protrusion 124 contrasts from the shallower PN junction shown in FIG. 2 (e.g., an upward protrusion toward the drain region). The shallower section of the PN junction of the embodiment of FIG. 2 helps to fully deplete the drift region at or under the drain region.

Figure 4:
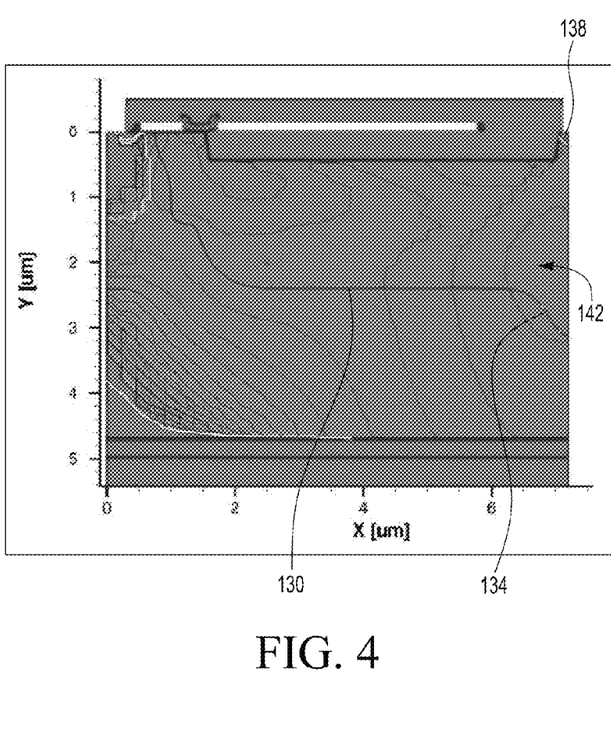
FIG. 4 is a cross-sectional, schematic depiction of impact ionization levels in a conventional field drift LDMOS transistor.
Figure 5:
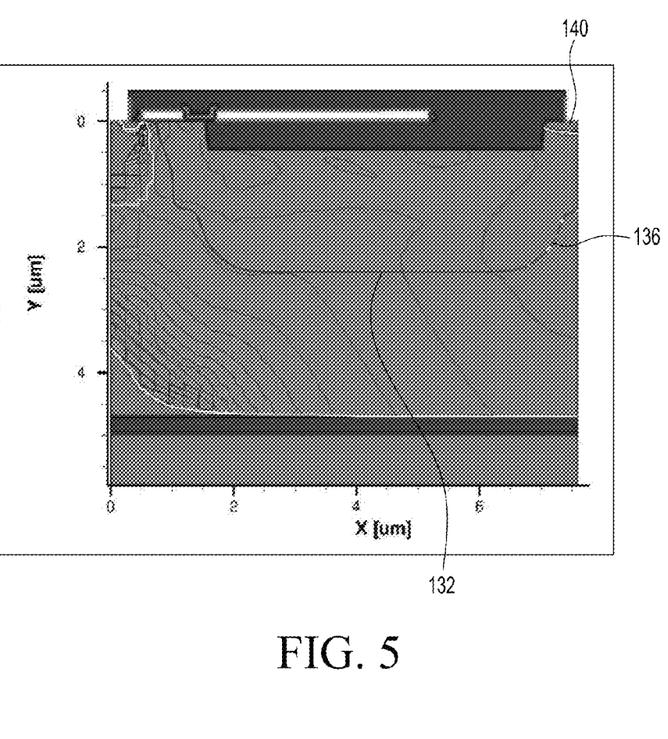
FIG. 5 is a cross-sectional, schematic depiction of impact ionization levels in an exemplary field drift LDMOS transistor with a drift region having a drain-side section configured in accordance with one embodiment.

Simulations of resulting impact ionization levels are shown in FIGS. 4 and 5. FIG. 4 depicts the levels for a conventional device with a typical drift region configuration. FIG. 5 depicts the levels for an exemplary device configured in accordance with one embodiment. Respective PN junctions along the drift region are indicated by lines 130, 132 for reference. As described above, the respective PN junctions include corresponding sections 134, 136 under respective drain regions 138, 140 that extend from and toward the drain region, respectively. Darker shading is indicative of higher impact ionization levels. During operation, the conventional device experiences impact ionization levels in a hotspot region 142 not reached in the exemplary device shown in FIG. 5. The hotspot region 142 corresponds with the portion of the drift region at or under the drain region 138 in which full depletion does not occur. The presence of the hotspot region 142 leads to a BVDSS level of 121.3V. In contrast, breakdown does not occur in the exemplary device of FIG. 5 until 131.2V.

Figure 6:
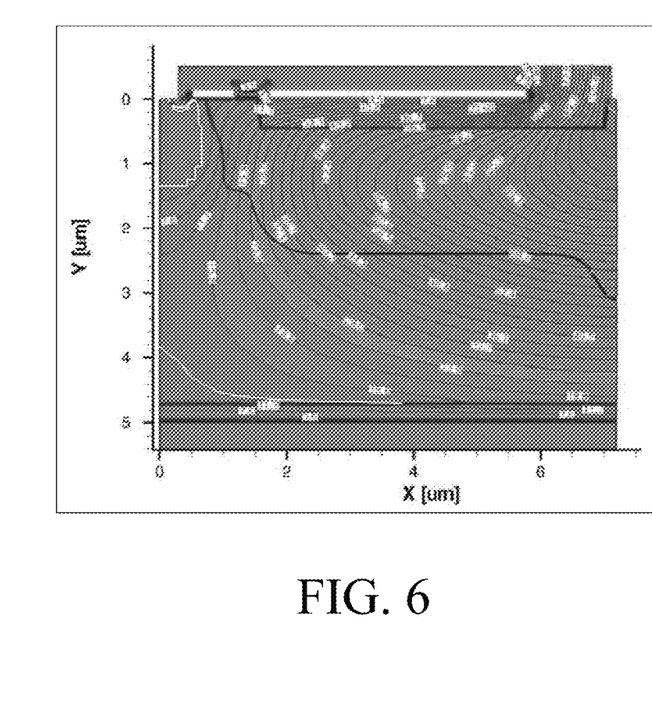
FIG. 6 is a schematic depiction of equipotential lines at breakdown in a conventional field drift LDMOS transistor.
Figure 7:
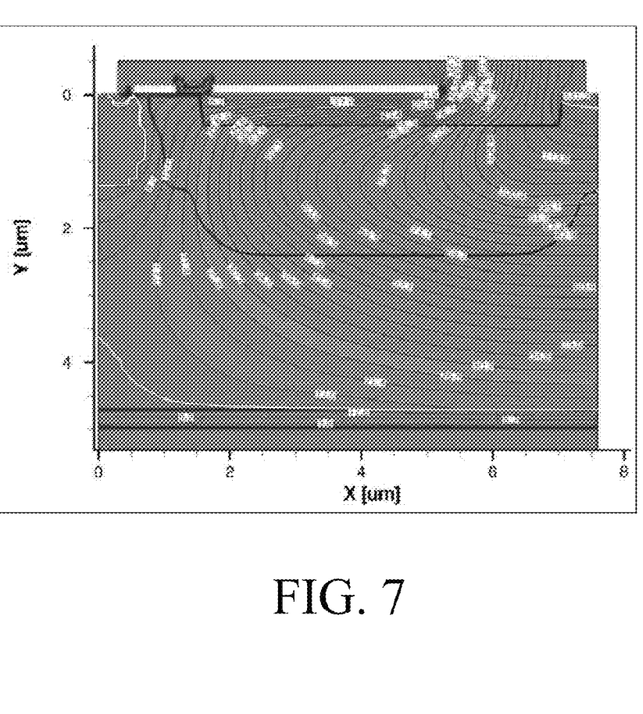
FIG. 7 is a schematic depiction of equipotential lines at breakdown in an exemplary field drift LDMOS transistor with a drift region having a drain-side section configured in accordance with one embodiment.

FIGS. 6 and 7 depict the equipotential lines at breakdown for the device simulations of the conventional and exemplary devices. As shown in FIG. 7, the voltage levels for the exemplary device are higher at or under the drain region along the PN junction. For example, the voltage levels fall within the range from about 87.3V to about 100.4V. In contrast, the voltage levels in the conventional device along the PN junction in the corresponding region are about 52.4V to about 68.7. FIG. 7 also shows the even or equal spacing of the equipotential lines in the exemplary device throughout the drift region along the PN junction. Such even spacing is indicative of a near constant electric field, which, in turn, is indicative of the RESURF effect.

Figure 8:
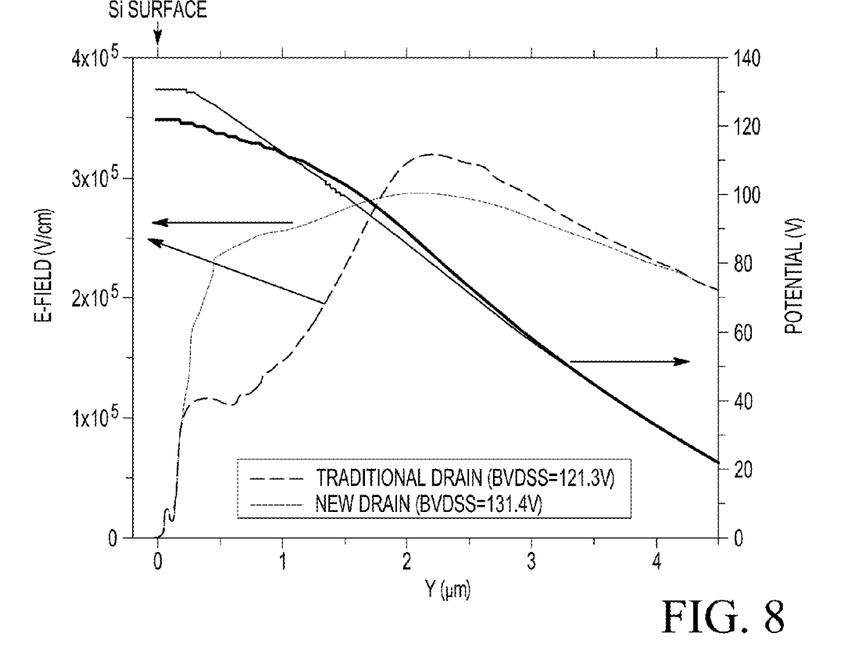
FIG. 8 is a graphical plot comparing the electric field and potential at a drain-side section of a drift region of a conventional LDMOS transistor and an exemplary field drift LDMOS transistor configured in accordance with one embodiment.

FIG. 8 depicts the electric field and potential voltage distributions at the drain-side end of the drift region as a function of depth for the device simulations of the conventional and exemplary devices. The enhancement of the RESURF effect of the electric field leads to a more even or uniform electric field distribution in the exemplary device (labeled as the "NEW DRAIN" device). The potential voltage distribution for the exemplary device is thus flatter. For instance, the exemplary device has a lower potential at or near the surface of the substrate.

Figure 9:
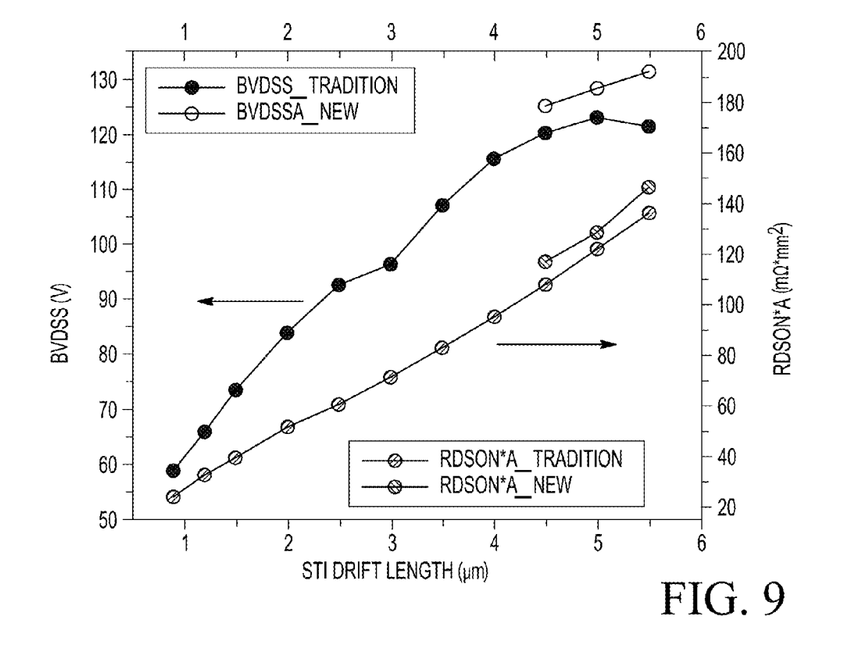
FIG. 9 is a graphical plot comparing the breakdown voltage (BVDSS) and on-resistance (Rdson) of a conventional LDMOS transistor and an exemplary field drift LDMOS transistor configured in accordance with one embodiment.

FIG. 9 is a graphical plot of BVDSS and Rdson values for conventional and exemplary devices of varying field drift lengths (e.g., STI drift lengths). For field drift lengths above about 4.5 μm, the exemplary device exhibits an improved BVDSS value without a significant detriment in increased Rdson. The improvement is enhanced at or around a field drift length of about 5.5 μm.

Figure 10:
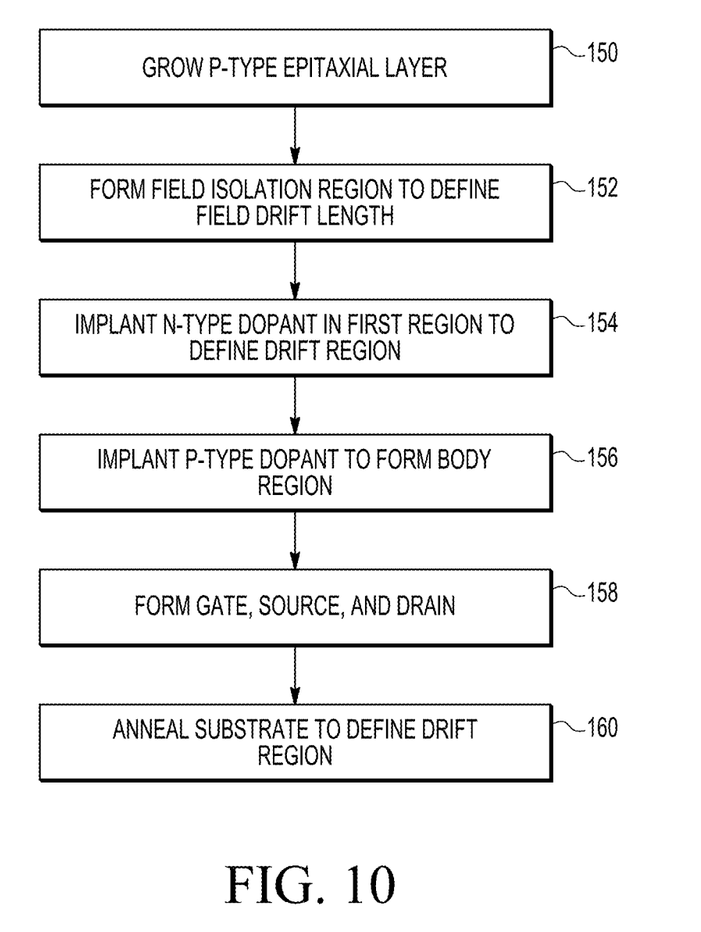
FIG. 10 is flow diagram of an exemplary fabrication sequence to construct a field drift LDMOS transistor having a drain-side section configured in accordance with one embodiment.

FIG. 10 shows an exemplary fabrication method for fabricating a device with a drift region having a drain-side section configured as described above. The method may be directed to fabricating a reduced surface field (RESURF) transistor having one or more of the features described above. The transistor is fabricated with a semiconductor substrate, the regions or layers of which may have the conductivity types of the n-channel examples described above, or be alternatively configured to support a p-channel device. The method includes a sequence of acts, only the salient of which are depicted for convenience in illustration. The ordering of the acts may vary in other embodiments. The fabrication method is not limited to any particular doping mechanism, and may include future developed doping techniques.

The method may begin with, or include, an act 150 in which a p-type epitaxial layer (p-epi) is grown on a heavily doped p-type semiconductor substrate. In some cases, the act 150 includes the formation via, e.g., ion implantation, of one or more barrier layers in the epitaxial layer. The barrier layer may be configured via a mask to extend across an active area of the RESURF transistor. In some cases, the act 150 includes the growth of another p-type epitaxial layer. Any number of epitaxial layers may be grown.

In this embodiment, an STI region is formed in act 152 in the substrate. The STI region may be formed via any now known or hereafter developed procedure. For example, the act 152 may include the formation of a trench and the deposition (e.g., chemical vapor deposition, or CVD) of one or more materials in the trench. In some embodiments, the trench is filled with silicon oxide. Additional or alternative materials may be deposited. In an alternative embodiment, the STI region is formed after the drift region is formed.

In act 154, the substrate is doped in a first region of the epitaxial layer. The doping procedure is directed to forming the drift region of the transistor. The doping procedure may include an n-type dopant implantation. For example, the n-type region may be formed with a mask such that the first region corresponds with the drift region shown in FIG. 1. The first region may thus have a lateral profile with an upright or vertical cut-off on the drain side of the drift region to diminish the drift region at or under the drain region, as described above. In other embodiments, the cut-off may be offset from vertical to configure the resulting dopant concentration profile at or under the drain region as desired. The ion implantation procedure may be combined with one or more annealing or other diffusion procedures that distribute the implanted dopant ions toward a second or final profile or region for the drift region.

In act 156, a p-type well is formed by doping a body region of the substrate. In some embodiments, the act 154 includes an implantation procedure. The body region may be spaced from or adjacent to the drift region as described above. A heavily doped p-type contact region for the body region may be formed in the p-type well via a separate ion implantation procedure.

more metal layers may be deposited. Any number of additional STI regions may be formed.

The embodiments described above include devices and methods of fabricating devices with a drift region having a drain-side section configured as described above. The table below provides simulation data for three examples of the disclosed devices. The data specifies the breakdown voltage (BVDSS) and drain-source resistance (Rdson) over a given device area (A) for several exemplary drift lengths. The simulation data for the above-described devices is presented by comparison with (i) a traditional field drift LDMOS device and (ii) an LDMOS device with a cut-off or thinned drift region drain-side section. For each drift length, the LDMOS with the thinned or cut-off drift region drain-side section achieves the highest breakdown voltage without any or minimal increase in drain-source resistance.

| LDMOS Drift Type | 4.5 μm Drift Length | | 5.0 μm Drift Length | | 5.5 μm Drift Length | |
|---|---|---|---|---|---|---|
| | BVDSS (V) | Rdson*A (mΩ*mm$^2$) | BVDSS (V) | Rdson*A (mΩ*mm$^2$) | BVDSS (V) | Rdson*A (mΩ*mm$^2$) |
| Traditional | 120.1 | 107.81 | 122.9 | 121.55 | 121.3 | 136.0 |
| Thin/Cutoff | 124.9 | 116.5 | 128.2 | 128.0 | 131.2 | 145.8 |

The fabrication process may then include one or more procedures collectively shown in act 158. The procedures may be implemented in various orders. Additional or alternative procedures may be implemented. A gate structure may initially be formed. Source and drain regions may then be formed, using the gate structure for self-alignment of the source region. One or more n-type ion implantation procedures may be performed. For example, formation of one or both of the source region and the drain region may include a moderate implant before formation of sidewall spacers of the gate structure to create one or more transition regions (see, e.g., FIG. 1). A heavy implant after formation of the sidewall spacers may then be implemented to form the source and/or drain regions adjacent to such transition regions.

The drain region is formed in the act 158 in a region that overlaps with the first or initial region of the drift region. The overlap may define a conduction path for the transistor. The overlap, however, does not extend laterally across the region in which the drain is formed, as described above and shown in FIG. 1.

In act 160, the substrate is annealed. The manner in which the annealing procedure is implemented may vary. The annealing procedure may result redistributing the dopant ions for the drift region. The drift region may thus extend laterally across the second region, but in a diminished capacity as described above.

The implantation and annealing procedures may be configured such that the drift region under or along the drain region includes a first section in the conduction path and a second, thinner section outside of the conduction path. The first section may thus form a current pass or path, while the second section is configured to enhance the RESURF effect through easier depletion. The first section may have a higher dopant concentration level than the second section to maintain a suitably low resistance for the current pass.

Additional acts may be implemented at various points during the fabrication procedure. For example, one or more acts may be directed to defining an active area of the device. In some cases, such acts may include the formation of one or more device isolating wells, layers, or other regions. One or The disclosed devices may include a drift region that overlaps a drain region partially or with an otherwise diminished profile. The diminished profile may include a lower dopant concentration level or distribution and/or a thinner region under the drain region. The diminished profile may lead to a shallower PN junction along the drift region under the drain region. The diminished profile may lead to full depletion of the drift region under the drain region during operation. The RESURF effect may thus be enhanced despite drift region configurations having a long field drift region.

In a first aspect, a device includes a semiconductor substrate, source and drain regions in the semiconductor substrate, a channel region in the semiconductor substrate between the source and drain regions through which charge carriers flow during operation from the source region to the drain region, and a drift region in the semiconductor substrate, on which the drain region is disposed, and through which the charge carriers drift under an electric field arising from application of a bias voltage between the source and drain regions. A PN junction along the drift region includes a first section at the drain region and a second section not at the drain region, and the drift region has a lateral profile that varies such that the first section of the PN junction is shallower than the second section of the PN junction.

In a second aspect, an electronic apparatus includes a substrate and a transistor disposed in the substrate. The transistor includes a first semiconductor region having a first conductivity type, second and third semiconductor regions having a second conductivity type, disposed above the first semiconductor region, and between which a voltage is applied during operation, a fourth semiconductor region having the first conductivity type, disposed between the second and third semiconductor regions, and having a conduction region through which charge carriers flow between the second and third semiconductor regions during operation, and a fifth semiconductor region having the second conductivity type and in which the charge carriers drift between the third and fourth semiconductor regions under the applied voltage. The fifth semiconductor region is diminished at the third semiconductor region such that full depletion of the fifth semiconductor region is attained under the third semiconductor region upon application of the voltage.

In a third aspect, a method of fabricating a transistor includes implanting dopant in a first region of a substrate for formation of a drift region, and forming a drain region in a second region of the substrate. The first and second regions laterally overlap to define a conduction path for the transistor, and the first region does not extend laterally across the second region.

Semiconductor devices with a conductive gate electrode positioned over a dielectric or other insulator may be considered MOS devices, despite the lack of a metal gate electrode and an oxide gate insulator. Accordingly, the terms metal-oxide-semiconductor and the abbreviation "MOS" may be used even though such devices may not employ metals or oxides but various combinations of conductive materials, e.g., metals, alloys, silicides, doped semiconductors, etc., instead of simple metals, and insulating materials other than oxides (e.g., nitrides, oxy-nitride mixtures, etc.). Thus, as used herein, the terms MOS and LDMOS are intended to include such variations.

The present invention is defined by the following claims and their equivalents, and nothing in this section should be taken as a limitation on those claims. Further aspects and advantages of the invention are discussed above in conjunction with the preferred embodiments and may be later claimed independently or in combination.

While the invention has been described above by reference to various embodiments, it should be understood that many changes and modifications may be made without departing from the scope of the invention. It is therefore intended that the foregoing detailed description be regarded as illustrative rather than limiting, and that it be understood that it is the following claims, including all equivalents, that are intended to define the spirit and scope of this invention.

The invention claimed is:

1. A device comprising:
   a semiconductor substrate not having a silicon-on-insulator (SOI) construction;
   source and drain regions in the semiconductor substrate;
   a channel region in the semiconductor substrate between the source and drain regions through which charge carriers flow during operation from the source region to the drain region;
   a drift region in the semiconductor substrate, on which the drain region is disposed, and through which the charge carriers drift under an electric field arising from application of a bias voltage between the source and drain regions; and
   a field isolation region in the semiconductor substrate on the drift region such that the field isolation region defines a field drift portion of the drift region under the field isolation region through which the charge carriers drift toward the drain region, wherein the drift region includes a current pass portion adjacent the field isolation region linking the field drift portion and the drain region;
   wherein the field drift portion has a lateral length of approximately 5 microns or more,
   wherein a PN junction along the drift region comprises a first section at the drain region and a second section not at the drain region, and
   wherein the drift region has a lateral profile that varies such that the first section of the PN junction is shallower than the second section of the PN junction.

2. The device of claim 1, wherein the drift region necks down at the drain region to define a current pass region coupled to the drain region, wherein the current pass region does not extend across the drain region.

3. The device of claim 1, wherein:
   the lateral profile of the drift region defines inner and outer areas of the drift region under the drain region, the inner and outer areas being disposed laterally adjacent one another with the inner area being laterally disposed between portions of the outer area; and
   the inner area has a lower dopant concentration level than the outer area such that full depletion is achieved laterally across the inner area under the drain region.

4. The device of claim 1, wherein:
   the lateral profile of the drift region defines inner and outer portions of the drift region under the drain region, the inner and outer portions being disposed laterally adjacent one another under the drain region with the outer portion laterally surrounding the inner portion; and
   the inner portion has a bottom shallower than a bottom of the outer portion such that full depletion is achieved vertically in the inner and outer portions.

5. The device of claim 1, wherein the lateral profile of the drift region has an inner dopant concentration cut-off under the drain region.

6. The device of claim 1, wherein a bottom of the field drift portion of the drift region is deeper than a bottom of the drift region at the drain region.

7. The device of claim 1, wherein the drift region is diminished at the drain region such that full depletion of the drift region is attained under the drain region upon application of the bias voltage.

8. The device of claim 7, wherein the bias voltage is greater than about 45 Volts.

9. The device of claim 1, wherein the semiconductor substrate comprises a bulk silicon substrate.

10. The device of claim 1, wherein the semiconductor substrate comprises a buried doped isolation layer.

11. An electronic apparatus comprising:
    a substrate not having a silicon-on-insulator (SOI) construction; and
    a transistor disposed in the substrate, the transistor comprising:
      a first semiconductor region having a first conductivity type;
      second and third semiconductor regions having a second conductivity type, disposed above the first semiconductor region, and between which a voltage is applied during operation;
      a fourth semiconductor region having the first conductivity type, disposed between the second and third semiconductor regions, and having a conduction region through which charge carriers flow between the second and third semiconductor regions during operation;
      a fifth semiconductor region having the second conductivity type and in which the charge carriers drift between the third and fourth semiconductor regions under the applied voltage; and
      a field isolation region on the fifth semiconductor region such that the field isolation region defines a field portion of the fifth semiconductor region under the field isolation region through which the charge carriers drift toward the third semiconductor region, wherein the fifth semiconductor region includes a current pass portion adjacent the field isolation region linking the field portion and the third semiconductor region;
    wherein the field portion has a lateral length of approximately 5 microns or more, and
    wherein the fifth semiconductor region is diminished at the third semiconductor region such that full depletion of the fifth semiconductor region is attained under the third semiconductor region upon application of the voltage.

12. The electronic apparatus of claim 11, wherein the fifth semiconductor region has a lateral profile such that a PN junction between the first and fifth semiconductor regions includes a first section under the third semiconductor region and a second section not under the third semiconductor region, and wherein the first section is shallower than the second section.

13. The electronic apparatus of claim 12, wherein:
the fifth semiconductor region comprises first and second portions disposed along the first and second sections of the PN junction, respectively; and
the first portion has a lower dopant concentration level than the second portion at a respective depth in the substrate.

14. The electronic apparatus of claim 12, wherein the second section laterally surrounds the first section.

15. The electronic apparatus of claim 12, wherein the second section of the PN junction is disposed along the field isolation region.

16. The electronic apparatus of claim 11, wherein the fifth semiconductor region necks down at the third semiconductor region to define a current pass region coupled to the third semiconductor region, wherein the current pass region does not extend across the third semiconductor region.

17. The electronic apparatus of claim 11, wherein the voltage is greater than about 45 Volts.

18. The electronic apparatus of claim 11, wherein the substrate comprises a bulk silicon substrate.

19. The electronic apparatus of claim 11, wherein the substrate comprises a buried doped isolation layer.

\* \* \* \* \*